US008928295B2

(12) United States Patent
Chang et al.

(10) Patent No.: US 8,928,295 B2
(45) Date of Patent: Jan. 6, 2015

(54) RECONFIGURABLE SWITCHED-CAPACITOR VOLTAGE CONVERTER CIRCUIT, INTEGRATED CIRCUIT (IC) CHIP INCLUDING THE CIRCUIT AND METHOD OF SWITCHING VOLTAGE ON CHIP

(71) Applicant: International Business Machines Corporation, Armonk, NY (US)

(72) Inventors: Leland Chang, NY, NY (US); Robert Montoye, Rochester, MN (US); Jae-sun Seo, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 57 days.

(21) Appl. No.: 13/727,580

(22) Filed: Dec. 26, 2012

(65) Prior Publication Data

US 2014/0152382 A1 Jun. 5, 2014

Related U.S. Application Data (63) Continuation of application No. 13/690,985, filed on Nov. 30, 2012.

(51) Int. Cl.
  *G05F 1/575* (2006.01)
  *G11C 5/00* (2006.01)
  *H02M 3/07* (2006.01)

(52) U.S. Cl.
  CPC ............ *G11C 5/00* (2013.01); *H02M 2003/072* (2013.01); *H02M 3/07* (2013.01)
  USPC .............................. 323/225; 323/282; 323/312

(58) Field of Classification Search
  USPC ......... 323/225, 244, 246, 270, 271, 275, 277, 323/278, 282, 283, 285, 289, 312
  See application file for complete search history.

(56) References Cited

U.S. PATENT DOCUMENTS

| 2008/0157733 | A1 | 7/2008 | Williams |
| 2009/0278520 | A1 | 11/2009 | Perreault et al. |

(Continued)

FOREIGN PATENT DOCUMENTS

| TW | 270254 B1 | 1/2007 |
| WO | WO2009067591 A2 | 5/2009 |

OTHER PUBLICATIONS

Leland Chang et al, "A Fully-Integrated Switched-Capacitor 2-to-1 Voltage Converter with Regulation Capability and 90% Efficiency at 2.3A/mm2", 2010.

(Continued)

*Primary Examiner* — Adolf Berhane
*Assistant Examiner* — Nusrat Quddus
(74) *Attorney, Agent, or Firm* — Law Office of Charles W. Peterson, Jr.; Louis J. Percello, Esq.

(57) ABSTRACT

A configurable-voltage converter circuit that may be CMOS and an integrated circuit chip including the converter circuit and method of operating the IC chip and circuit. A transistor totem, e.g., of 6 or more field effect transistors, PFETs and NFETs, connected (PNPNPN) between a first supply ($V_{in}$) line and a supply return line. A first switching capacitor is connected between first and second pairs of totem PN FETs pair of transistors. A second switching capacitor is connected between the second and a third pair of totem FETs. A configuration control selectively switches both third FETs off to float the connected end of the second capacitor, thereby switching voltage converter modes.

22 Claims, 8 Drawing Sheets

(56) References Cited

U.S. PATENT DOCUMENTS

| | | | |
|---|---|---|---|
| 2010/0117612 A1 | 5/2010 | Klootwijk et al. | |
| 2010/0214014 A1 | 8/2010 | Dennard et al. | |
| 2011/0278952 A1 | 11/2011 | Reimann et al. | |
| 2011/0298440 A1* | 12/2011 | Chang et al. | 323/299 |
| 2013/0076322 A1* | 3/2013 | Tateno et al. | 323/271 |
| 2013/0249508 A1* | 9/2013 | Rahimi et al. | 323/271 |

OTHER PUBLICATIONS

Y. K. Ramadass and A. P. Chandrakasan, "Voltage Scalable Switched Capacitor DCDC Converter for Ultra-Low Power On-Chip Applications," IEEE Power Electronics Specialists Conference (PESC), pp. 2353-2359, Jun. 2007.

H-P Le, M.D. Seeman, S.R. Sanders, V. Sathe, S. Naffziger and E. Alon, "A 32nm Fully Integrated Reconfigurable Switched-Capacitor DC-DC Converter Delivering 0.55W/mm2 at 81% Efficiency," ISSCC Dig. Tech. Papers, pp. 210-211, Feb. 2010.

M. Seeman and S.R. Sanders, "Analysis and Optimization of Switched-Capacitor DCDC Converters", 10th IEEE Workshop on Computers in Power Electronics (COMPEL), pp. 216-224, Jul. 2006.

Y. Ramadass, A. Fayed, B. Haroun, A. Chandrakasan, "A 0.16mm2 completely on-chip switched-capacitor DC-DC converter using digital capacitance modulation for LDO replacement in 45nm CMOS," ISSCC Dig. Tech. Papers, pp. 208-209, Feb. 2010.

Inshad Chowdhury and Dongsheng Ma, "An Integrated Reconfigurable Switched-Capacitor DC-DC Converter with a Dual-Loop Adaptive Gain-Pulse Control," International Symposium on Circuits and Systems, pp. 2610-2613, May 2008.

* cited by examiner

RECONFIGURABLE SWITCHED-CAPACITOR VOLTAGE CONVERTER CIRCUIT, INTEGRATED CIRCUIT (IC) CHIP INCLUDING THE CIRCUIT AND METHOD OF SWITCHING VOLTAGE ON CHIP

CROSS REFERENCE TO RELATED APPLICATION

The present invention is a continuation of U.S. patent application Ser. No. 13/690,985, "RECONFIGURABLE SWITCHED-CAPACITOR VOLTAGE CONVERTER CIRCUIT, INTEGRATED CIRCUIT (IC) CHIP INCLUDING THE CIRCUIT AND METHOD OF SWITCHING VOLTAGE ON CHIP" to Leland Chang et al., filed Nov. 30, 2012, assigned to the assignee of the present invention and incorporated herein by reference.

FIELD OF THE INVENTION

The present invention is related to voltage conversion techniques and, more particularly, to switched capacitor voltage converters and methods for use in integrated circuit devices.

BACKGROUND DESCRIPTION

Especially for complex Integrated Circuit (IC) chips and IC chips with arrays with a large number of devices, device leakages can overwhelm chip power be. A general application of leakage reduction techniques impairs performance and has been equally unpalatable. Accordingly, some designs use multiple supplies or a variable supply to selectively reduce supply voltage, e.g., supply one voltage during memory access and a second, lower voltage when memory cells are not being accessed.

Thus, some higher performance chips use on-chip voltage converters, e.g., switched-capacitor circuits, to reduce higher chip supply voltages to a level suitable for high performance circuit operation. State of the art switched-capacitor circuits inherently enable very high efficiency for ratioed conversion. For example, a 2:1 down conversion (0.5) has demonstrated at 90% efficiency. Such a voltage converter enables much higher supply voltage delivery to the chip for powering lower voltage circuit, e.g., providing a 2.0V supply to the chip may be converted down to 1.0V on-chip for 1V circuits. Linear regulators, which have been used for voltage conversion at ratios above 0.5, also achieve >90% efficiency for conversion at the higher performance end of the output voltage range, e.g., 1.3V to >1.2V conversion. However, efficiency falls off dramatically at the lower end of the output voltage range, e.g., ~50% for 1.3V→0.7V conversion and below.

Thus, there is a need for a high efficiency voltage converter for on-chip voltage conversion that provides uniform efficiency across a wide conversion range; and more particularly, a variable conversion ratio on-chip voltage converter, and especially a variable voltage switched-capacitor converter, that exhibits a high efficiency even at the lower end of the voltage conversion range.

SUMMARY OF THE INVENTION

A feature of the invention is improved power efficiency in down converting on-chip supply voltages;

Another feature of the invention is a switchable voltage supply, supplying low-voltage performance circuits with a reduced chip voltage;

Yet another feature of the invention is reduced chip supply switching noise;

Yet another feature of the invention is a switchable voltage supply, supplying low-voltage performance circuits with a reduced chip voltage, while improving power convertion efficiency and chip supply switching noise.

The present invention relates to a configurable-voltage converter circuit that may be CMOS and an integrated circuit chip including the converter circuit and method of operating the IC chip and circuit. A transistor totem, e.g., of 6 or more field effect transistors, PFETs and NFETs, connected (PNP-NPN) between a first supply ($V_{in}$) line and a supply return line. A first switching capacitor is connected between first and second pairs of totem PN FETs pair of transistors. A second switching capacitor is connected between the second and a third pair of totem FETs. A configuration control selectively switches both third FETs off to float the connected end of the second capacitor, thereby switching voltage converter modes.

Embodiments of the invention include:

A method of configuring on-chip supply voltage being supplied to one or more chip circuits, said method comprising: selecting a first voltage supply mode; floating one side of a first capacitor in a pair of series connected capacitors, the other side of said first capacitor being connected to a first side of a second capacitor of the series connected pair; alternately switching opposite sides of said second capacitor to a voltage supply output ($V_{out}$), one side of said second capacitor being alternately switched between a first supply voltage and said voltage supply output, the other side of said second capacitor being alternately switched between a second supply voltage and said voltage supply output, said voltage supply output supplying a first output voltage; selecting a second voltage supply mode; alternately floating and coupling said one side of said first capacitor to said first supply voltage and simultaneously switching the other side of said second capacitor to said voltage supply output when said one side is floating, said first side of said second capacitor being alternately switched in and out to said voltage supply output, the other side of said second capacitor being alternately switched between said second supply voltage and said voltage supply output, said voltage supply output supplying a second output voltage; and waiting to reselect said first voltage supply mode.

In this embodiment in said first voltage supply mode alternately switching said opposite sides comprises: floating one side of a first capacitor in a pair of series connected capacitors, the other side of said first capacitor being connected to a first side of a second capacitor of the series connected pair; asserting a first clock; coupling said first side of said second capacitor to said first supply voltage responsive to said first clock; coupling the other side of said second capacitor to said supply voltage output responsive to said first clock; asserting a second clock, said first clock and said second clock not overlapping; coupling said first side of said second capacitor to said supply voltage output responsive to said second clock; coupling the other side of said second capacitor to said second supply voltage responsive to said second clock; and returning to asserting said first clock.

In said second voltage supply mode alternately floating and coupling said one side and alternately switching said opposite sides comprises: asserting said first clock; coupling said one side of said first capacitor to said first supply voltage responsive to said first clock; coupling said other side of said second capacitor to said voltage supply output responsive to said first clock; asserting a second clock, said one side of said second capacitor being floated; coupling said other side of a said first capacitor to said voltage supply output responsive to said second clock; coupling said other side of said second capacitor to said second supply voltage responsive to said second clock; and returning to asserting said first clock. The first capacitor may be connected between a pair of FETs and floating said one side of said first capacitor comprises gating both FETs off. Floating said one side of said first capacitor further comprises gating on an FET shorting the opposite ends of both off FETs. The chip may be a CMOS chip, where said pair of FETs is a PFET and an NFET in a FET totem including alternate PFETs and NFETs; said other side of said first capacitor and said first side of a second capacitor of the series connected capacitor pair being connected between a second PN FET pair; and said other side of said second capacitor being connected between a second PN FET pair. Asserting said first clock may turn on totem PFETs with asserting said second clock turning on totem NFETs, the first PN FET pair being gated by said first clock and said second clock when said second mode is selected. The second supply voltage may be a supply return for said first supply voltage ($V_{in}$).

Another embodiment is a method of configuring on-chip supply voltage being supplied to one or more chip circuits, said method comprising: selecting a first voltage supply mode; floating one side of a first capacitor in a pair of series connected capacitors, the other side of said first capacitor being connected to a first side of a second capacitor of the series connected pair; and while said first voltage supply mode is selected, asserting a first clock; coupling said first side of said second capacitor to a first voltage supply line responsive to said first clock; coupling the other side of said second capacitor to an on-chip supply voltage output ($V_{out}$) responsive to said first clock; asserting a second clock, said first clock and said second clock not overlapping; coupling said first side of said second capacitor to said on-chip supply voltage output responsive to said second clock; coupling the other side of said second capacitor to a second voltage supply line responsive to said second clock; and returning to assert said first clock.

This embodiment further comprises: selecting a second voltage supply mode; and while said second voltage supply mode is selected, asserting said first clock; coupling said one side of said first capacitor to said first voltage supply line responsive to said first clock; coupling said other side of said second capacitor to said on-chip supply voltage output responsive to said first clock; asserting a second clock; coupling said one side of a said first capacitor to said on-chip supply voltage output responsive to said second clock; coupling said other side of said second capacitor to said second voltage supply line responsive to said second clock; and returning to assert said first clock. The first voltage supply mode may be a 2:1 configuration mode, said second voltage supply mode may be a 3:1 configuration mode and upon a next selection of said 2:1 mode, said method further comprising returning to float said one side of said first capacitor. The first capacitor is connected between a pair of FETs and floating said one side of said first capacitor comprises gating both FETs off. One of said first voltage supply line and said second voltage supply line may be a supply return line and the other may be a chip supply ($V_{in}$), floating said one side of said first capacitor further comprises gating on an FET shorting the opposite ends of both off FETs, and $V_{in}:V_{out}$ may be selectable as 2:1 or 3:1. The chip may be a CMOS chip, with said pair of FETs being a PFET and an NFET in a FET totem including alternate PFETs and NFETs; said other side of said first capacitor and said first side of a second capacitor of the series connected capacitor pair being connected between a second PN FET pair; and said other side of said second capacitor being connected between a second PN FET pair. Asserting said first clock turns on totem PFETs and asserting said second clock turns on totem NFETs, the first PN FET pair being gated by said first clock and said second clock when said second mode is selected. The second supply voltage line may be said supply return for said first supply voltage line ($V_{in}$).

Another embodiment is a method of configuring on-chip supply voltage being supplied to one or more CMOS chip circuits, said method comprising: selecting a first voltage supply mode; floating one side of a first capacitor in a pair of series connected capacitors connected to a field effect transistor (FET) totem connected between a first supply ($V_1$) and a second supply ($V_2$), the other side of said first capacitor being connected to a first side of a second capacitor of the series connected pair, said one side being connected between a first PFET and NFET (PN FET) totem pair, said other side and said first side being connected between a second PN FET totem pair and the opposite side of said second capacitor being connected between a third PN FET totem pair; alternately turning PFETs off and on and NFETs on and off in the second and third PN FET totem pair, said second and third PN FET totem pairs alternately switching opposite sides of said second capacitor to a voltage supply output ($V_{out}$); selecting a second voltage supply mode; alternately turning PFETs off and on and NFETs on and off in the first, second and third PN FET totem pairs, said first PN FET totem pair alternately floating and coupling said one side of said first capacitor to $V_1$, and said second and third PN FET totem pairs simultaneously alternately switching said other side of said second capacitor to $V_{out}$ when said one side is floating, said second and third PN FET totem pairs alternately switching opposite sides of said second capacitor to $V_{out}$; and waiting to reselect said first voltage supply mode.

In this embodiment in said first voltage supply mode, alternately switching said opposite sides may comprise: in a first half cycle PFETs in both said the second and third PN FET totem pair being switched on, said PFET in said second PN FET totem pair switching said first side of said second capacitor to $V_1$, and said PFET in said third PN FET totem pair switching said opposite side of said second capacitor to $V_{out}$, the corresponding NFETs in both pair being off; and in a second half cycle by switching PFETs off and NFETs on, on NFETs switching said first side of said second capacitor to $V_{out}$ and said other side of said second capacitor to $V_2$. Floating one side in said first voltage supply mode may comprise: shorting said first PN FET pair; and holding off both the PFET and NFET in said first PN FET pair, said first side being connected between said PFET and NFET. $V_1$ may be $V_{in}$, $V_2$ may be ground and shorting said first PN FET pair comprises turning on a shunting PFET in parallel with said first PN FET pair.

Alternately switching said opposite sides in said first voltage supply mode may comprise: asserting a PFET clock low, an NFET clock being low while said PFET clock is asserted, said PFET in said second PN FET pair coupling said first side of said second capacitor to one side of said shunt PFET, said PFET in said third PN FET pair coupling said other side of said second capacitor to said $V_{out}$; driving said PFET clock high; asserting said NFET clock high, said NFET in said second PN FET pair coupling said first side of said second capacitor to $V_{out}$, said NFET in said third PN FET pair coupling the other side of said second capacitor to said supply return; driving said NFET clock low; and returning to asserting said PFET clock low. Alternately floating and coupling said one side of said first capacitor in said second voltage supply mode may comprise: turning said shunting PFET off; and passing said PFET clock through a PFET clock gate to the gate of said PFET in said first PN FET pair and said NFET through an NFET clock gate to the gate of said NFET in said first PN FET pair. $V_1$ may be ground, $V_2$ may be $V_{in}$, shorting said first PN FET pair comprises turning on a shunting NPFET in parallel with said first PN FET pair, and $V_{in}:V_{out}$ may be selectable as 2:1 in said first voltage supply mode or 3:1 in said second voltage supply mode.

Yet another embodiment is a method of configuring on-chip supply voltage being supplied to one or more CMOS chip circuits, said method comprising: asserting a configuration select in a first state, said first state selecting a first voltage supply mode; turning a shunting field effect transistor (FET) on, said shunting FET shorting a first PFET and NFET pair (PN FET pair) in a FET totem connected between a first supply voltage ($V_1$) and a second supply voltage ($V_2$), one side of a first capacitor in a pair of series connected capacitors connected between the PFET and NFET in said first PN FET pair; blocking a PFET clock and an NFET clock to said first PN FET pair, both the PFET and NFET in said first PN FET pair being held off, said one side of said first capacitor floating; switching on PFETs in said the second and third PN FET totem pair in a first half cycle, said PFET in said second PN FET totem pair switching said first side of said second capacitor to $V_1$, and said PFET in said third PN FET totem pair switching the opposite side of said second capacitor to $V_{out}$, the corresponding NFETs in both pair being off; switching said PFETs off in a second half cycle and NFETs on, on NFETs switching said first side of said second capacitor to $V_{out}$ and said other side of said second capacitor to $V_2$; returning to switching on PFETs until said configuration select is asserted in a second state, and when asserted in said second state a second voltage supply mode has been selected; and then turning off said shunting FET; passing said PFET clock and said NFET clock to said first PN FET pair, both the PFET and NFET in said first PN FET pair being gated on by a respective clock; switching on PFETs in the first, second and third PN FET totem pairs in a first half cycle, said PFET in said first PN FET totem pair switching said one side of said first capacitor to $V_1$, and said PFET in said third PN FET totem pair switching the opposite side of said second capacitor to $V_{out}$, the corresponding NFETs in said first, second and third PN FET totem pairs being off; switching said PFETs off in a second half cycle and NFETs on, on NFETs switching said first side of said second capacitor to $V_{out}$ and said other side of said second capacitor to $V_1$; and returning to switching on PFETs in all three PN FET totem pairs until said first voltage supply mode is reselected. $V_1$ may be $V_{in}$, $V_1$ may be ground, and $V_{in}:V_{out}$ may be selectable as 2:1 in said first voltage supply mode or 3:1 in said second voltage supply mode.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Semiconductor technology and chip manufacturing advances have resulted in a steady decrease of chip feature size to increase on-chip circuit switching frequency (circuit performance) and the number of transistors (circuit density). Density has increased as a result of shrinking/reducing overall device or field effect transistor (FET) size by reducing feature sizes and, correspondingly, device minimum dimensions. A typical shrink includes horizontal dimensions (e.g., minimum channel length) and vertical dimensions, e.g., channel layer depth, gate dielectric thickness, junction depths and etc. Smaller device features have improved device performance and reduced device operating conditions, i.e., chip and correspondingly, device supply voltages and voltage swings.

Generally, all other factors being constant, the active power consumed by a given logic unit increases linearly with switching frequency (f), i.e., with performance. Also, higher operating frequency requires higher current (I) to switch loads faster. Thus, not withstanding the decrease of chip supply voltage (V), chip power (P=VI) consumption has increased as well. Both at the chip and system levels, a natural result of this increase in chip power is escalated cooling and packaging costs. For low end systems (e.g., handhelds, portable and mobile systems), where battery life is crucial, reducing net power consumption is important. However, such a power reduction must come without degrading chip/circuit performance below acceptable levels.

To minimize semiconductor circuit power consumption while maximizing performance, most integrated circuits (ICs) are made in the well-known complementary insulated gate FET technology known as CMOS. A typical CMOS circuit includes paired complementary devices, i.e., an n-type FET (NFET) paired with a corresponding p-type FET (PFET), usually gated by the same signal and, typically, driving a capacitive load. Ideally, when the gate of a NFET is below some positive threshold voltage ($V_T$) with respect to its source, the NFET is off, i.e., the switch is open. Above $V_T$, the NFET is on conducting current, i.e., the switch is closed. Similarly, a PFET is off when its gate is above its $V_T$, i.e., less negative, and on below $V_T$.

A CMOS inverter, for example, is a PFET and NFET pair that are series connected between a power supply voltage ($V_{dd}$) and ground (GND). Both are gated by the same input and both drive the same output, more or less, a purely capacitive load. The PFET pulls the capacitive load high and the NFET pulls the load low at opposite input signal states. Since the pair of devices have operating characteristics that are, essentially, opposite each other, when one device (e.g., the NFET) is on and conducting (modeled simply as a closed switch), the other device (the PFET) is off, not conducting (ideally modeled as an open switch) and, vice versa. Thus, there is no static or DC current path in an ideal CMOS circuit; ideal CMOS circuits use no static or DC power; and only consume transient power from current charging and discharging capacitive loads. Coincidentally, most noise on chip supply lines is switching noise from transient current switching the loads.

At chip level, supply switching currents through supply line resistances and parasitic inductance can generate significant line noise at the chip power pins and/or pads, e.g., several hundred millivolt (mV) spikes on a one volt (1V) supply line. These current spikes waste power, impair circuit operation, reduce performance, and may cause sporadic errors that are difficult to locate and diagnose. Without changing chip power, chip supply currents can be reduced by increasing chip supply voltage above on-chip operating supply voltage. However, high performance circuits normally operate at maximum tolerable supply voltage, where higher supply voltages may cause permanent circuit damage.

Moreover, in practice, typical FETs are much more complex than switches and transient power for circuit loads accounts for only a portion of CMOS chip power consumption. FET drain to source current (DC current and so, DC power consumed) is dependent upon circuit conditions and device voltages. Especially since device $V_T$ is directly proportional to gate dielectric thickness, as FET features (including gate dielectric thickness) shrink, off FETs conduct what is known as subthreshold current, i.e., at gate biases below threshold for NFETs and above for PFETs. Further, for a particular device, subthreshold current increases exponentially with the magnitude of the device's drain to source voltage ($V_{ds}$) and reduces exponentially with the magnitude of the device's $V_T$. This is especially true in what is known as partially depleted (PD) or fully depleted (FD) silicon on insulator (SOI) technologies, where subthreshold leakage has been shown to increase dramatically, such that it may be the dominant source of leakage. Additional device leakages including gate leakages (i.e., gate to channel, gate to source or drain and gate induced drain leakage (GIDL)) and source/drain junction leakages also contribute to static power.

When multiplied by the millions and even billions of devices on a state of the art SRAM processor cache, for example, even one hundred picoAmps (100 pA) of leakage in each of a eight million cells results in chip leakage on the order of eight hundred milliAmps (800 mA). Thus, as FET features have shrunk, these leakage sources have become more prominent. Generally, approaches to resolving these device problems have been to increase device $V_T$ to mitigate subthreshold leakage, or to reduce supply voltage. Especially for complex chips and arrays with a large number of devices, device leakage (both gate and subthreshold) chip leakage power can be overwhelming, but general application of leakage reduction techniques impairs performance and has been equally unpalatable. Accordingly, some designs use multiple supplies or a variable supply to selectively reduce supply voltage, e.g., supply one voltage during memory access and a second, lower voltage when memory cells are not being accessed.

Figure 1:
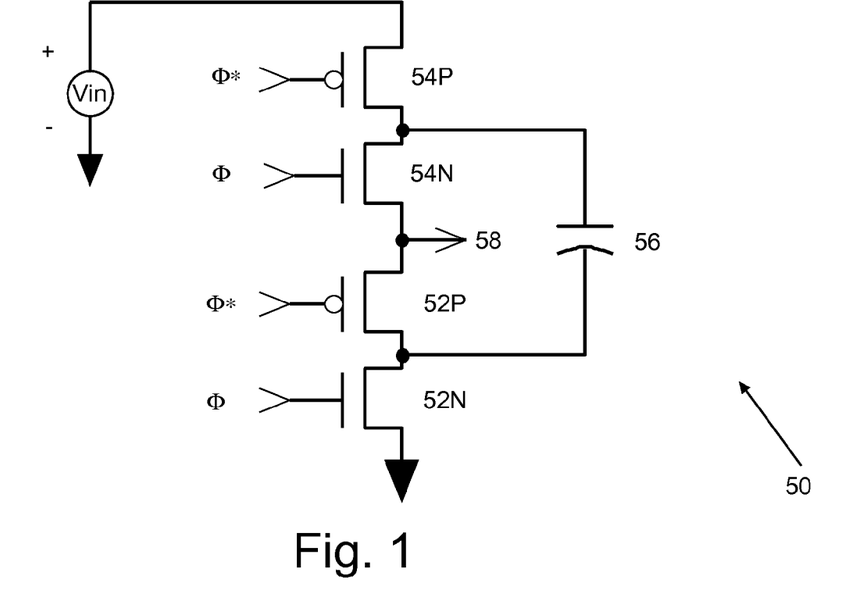
FIG. 1 shows an example of a basic, switched-capacitor, voltage converter circuit for providing a reduced on-chip supply voltage from a higher, chip supply voltage.

FIG. 1 shows an example of a basic, switched-capacitor, voltage converter circuit 50 for providing a reduced (2:1) on-chip supply voltage ($V_{out}$) from a higher, chip supply voltage ($V_{in}$). The circuit includes four FETs in a totem or push-pull arrangement between $V_{in}$ and a second supply voltage or supply return (ground (GND)). The FET totem of this example includes two NFETs 52N, 54N and two PFETs 52P, 54P, and switches a single capacitor 56 with capacitance C. The NFETs 52N, 54N are driven by a first or NFET phase ($\Phi$) and the PFETs 52P, 54P are driven by a second or PFET, in-phase non-overlapping phase ($\Phi^*$) with an operating or switching frequency (f). Each PN pair of devices, 52N, 52P and 54N, 54P, drive one end of the capacitor 56 and PFET 52P and NFET 54N drive the output 58.

Figure 2A:
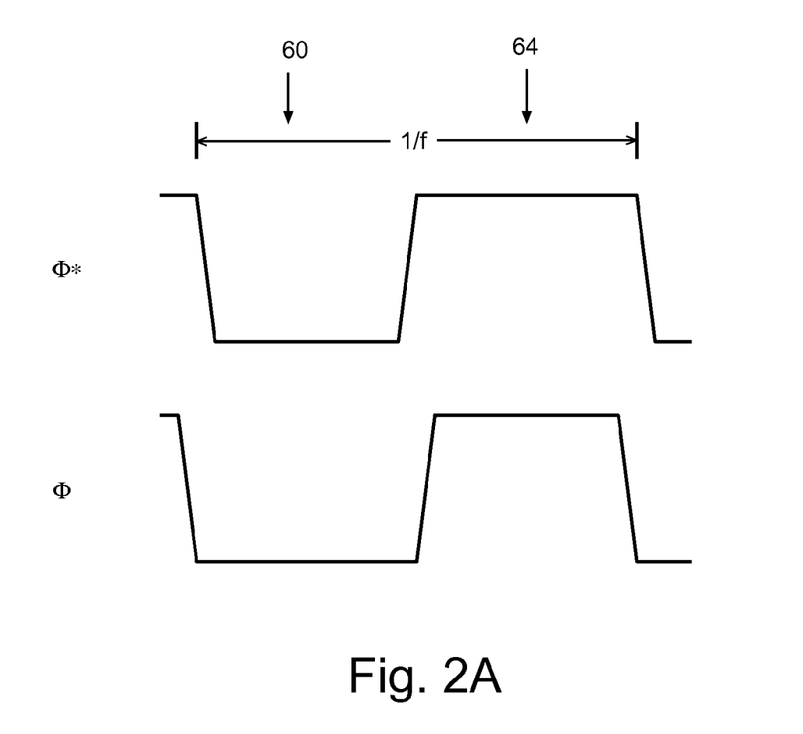
FIGS. 2A-C show an example of operation of, and a timing diagram for, the voltage converter circuit dividing supply voltage $V_{in}$, by alternately switching the charge on capacitor.
Figure 2B:
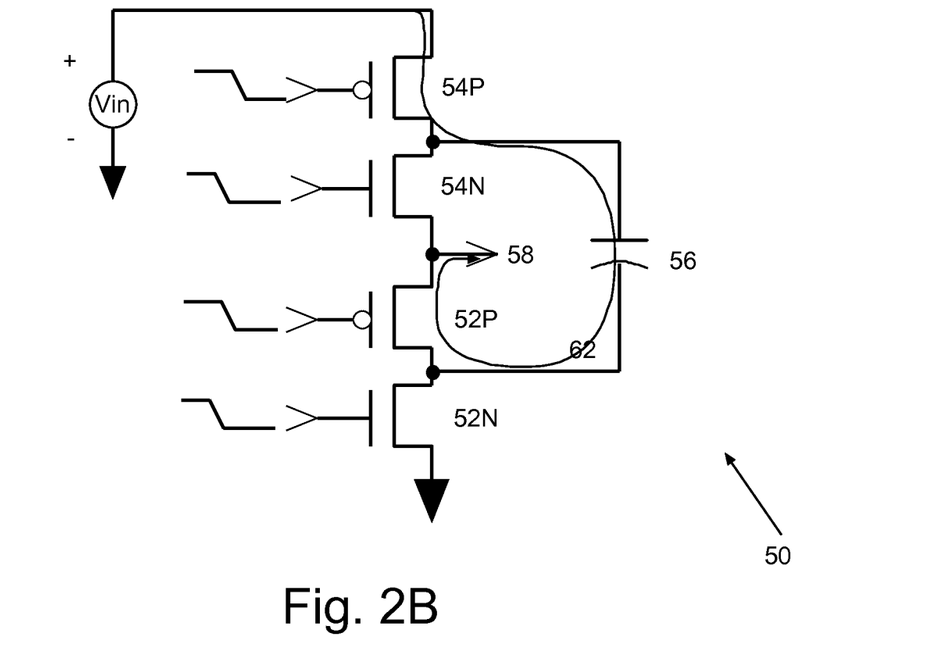
Figure 2C:
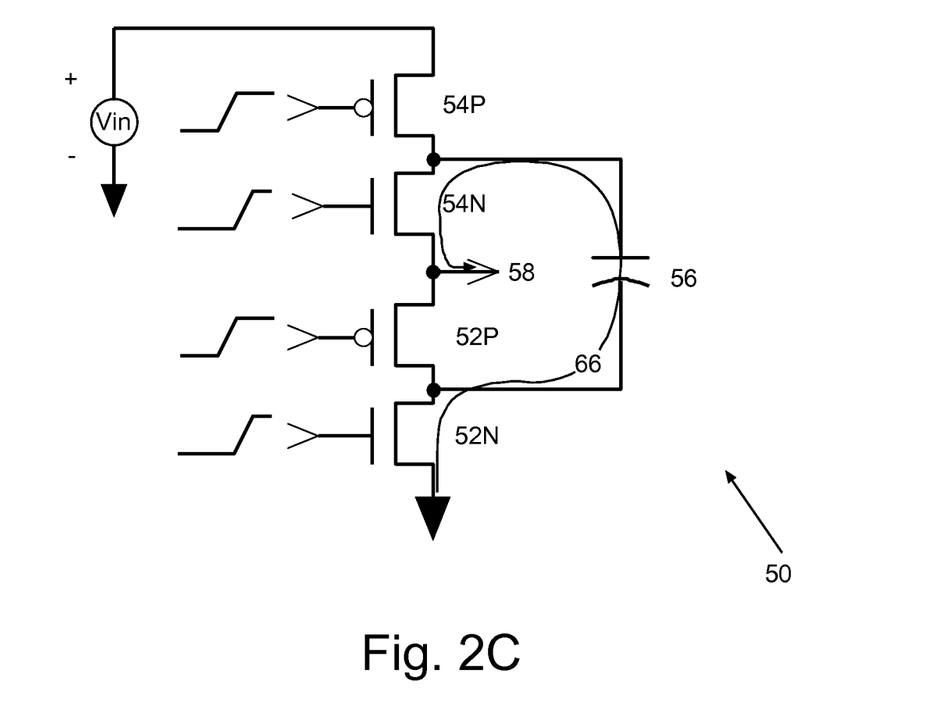

FIGS. 2A-C show an example of operation of, and a timing diagram for, the voltage converter circuit 50 for dividing supply voltage $V_{in}$, by alternately switching the charge on capacitor 56. Ideally, in a completely efficient (100%) down conversion for this 2:1 voltage converter circuit 50, $2V_{out}=V_{in}$; or, $V_{out}=\frac{1}{2}V_{in}$. In practice, however, there is some inherent inefficiency ($\Delta$), where $\Delta=\frac{1}{2}V_{in}-V_{out}$. Voltage converter efficiency, therefore, is $1-\Delta$.

When both $\Phi$ and $\Phi^*$ transition low 60, both NFETs 52N, 54N are off and both PFETs 52P, 54P are on, and the loop/output current ($I_{load1}$) 62 is the PFET source to drain current. Since, I=CdV/dt, for a given switching frequency f, $dV/dt\approx V_{in}\Delta f$ and $I_{load1}\approx CV_{in}\Delta f$. Similarly, when both $\Phi$ and $\Phi^*$ transition high 64, both PFETs 52P, 54P are off and both NFETs 52N, 54N are on, the loop/output current ($I_{load2}$) 66 is the NFET source to drain current, and again, $I_{load2}\approx CV_{in}\Delta f$. Thus, at steady state, $I_{load}=I_{load1}+I_{load2}\approx 2CV_{in}\Delta f$, and $V_c\approx V_{out}=\frac{1}{2}V_{in}(1-\Delta)$.

Figure 3:
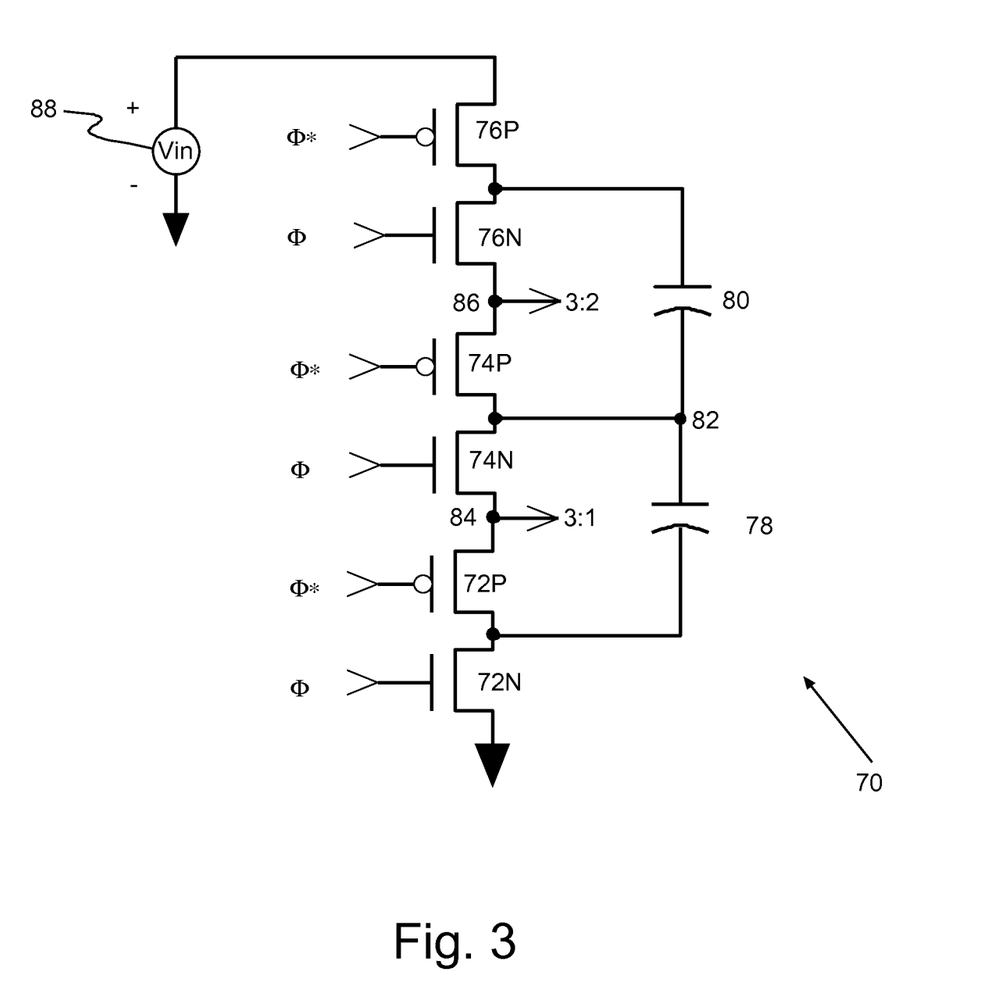
FIG. 3 shows an example of a 3:1 switched-capacitor, multi-voltage converter circuit.

FIG. 3 shows an example of a somewhat more complex, switched-capacitor, multi-voltage converter circuit 70, again in an FET totem arrangement, substantially similar to the arrangement for switched-capacitor, 2:1 voltage converter circuit 50 of FIGS. 1A-C. In this example, the multi-voltage converter circuit 70 includes six FETs, three NFETs 72N, 74N, 76N and three PFETs 72P, 74P, 76P, driving two capacitors 78, 80, connected 82 between NFET 74N and PFET 74P. In this example, using substantially the same analysis, it can be shown that the two down converted voltage outputs are a 3:1 down converted output 84 ($V_{out3:1}\approx\frac{1}{3}V_{in}$) and a 3:2 down converted output 86 ($V_{out3:2}\approx\frac{2}{3}V_{in}$) of $V_{in}$ 88 with an inherent efficiency of $(1-2\Delta)$, where $\Delta=\frac{1}{3}V_{in}-V_{out3:1}$. Providing a single circuit with a selectable 2:1 or 3:1, stepped down voltages from both of these switched-capacitor, voltage converter circuits 50, 70, requires additional logic and voltage switching capability, e.g., a pass gate multiplexor, that may introduce additional circuit loss, i.e., additional inefficiency.

Figure 4A:
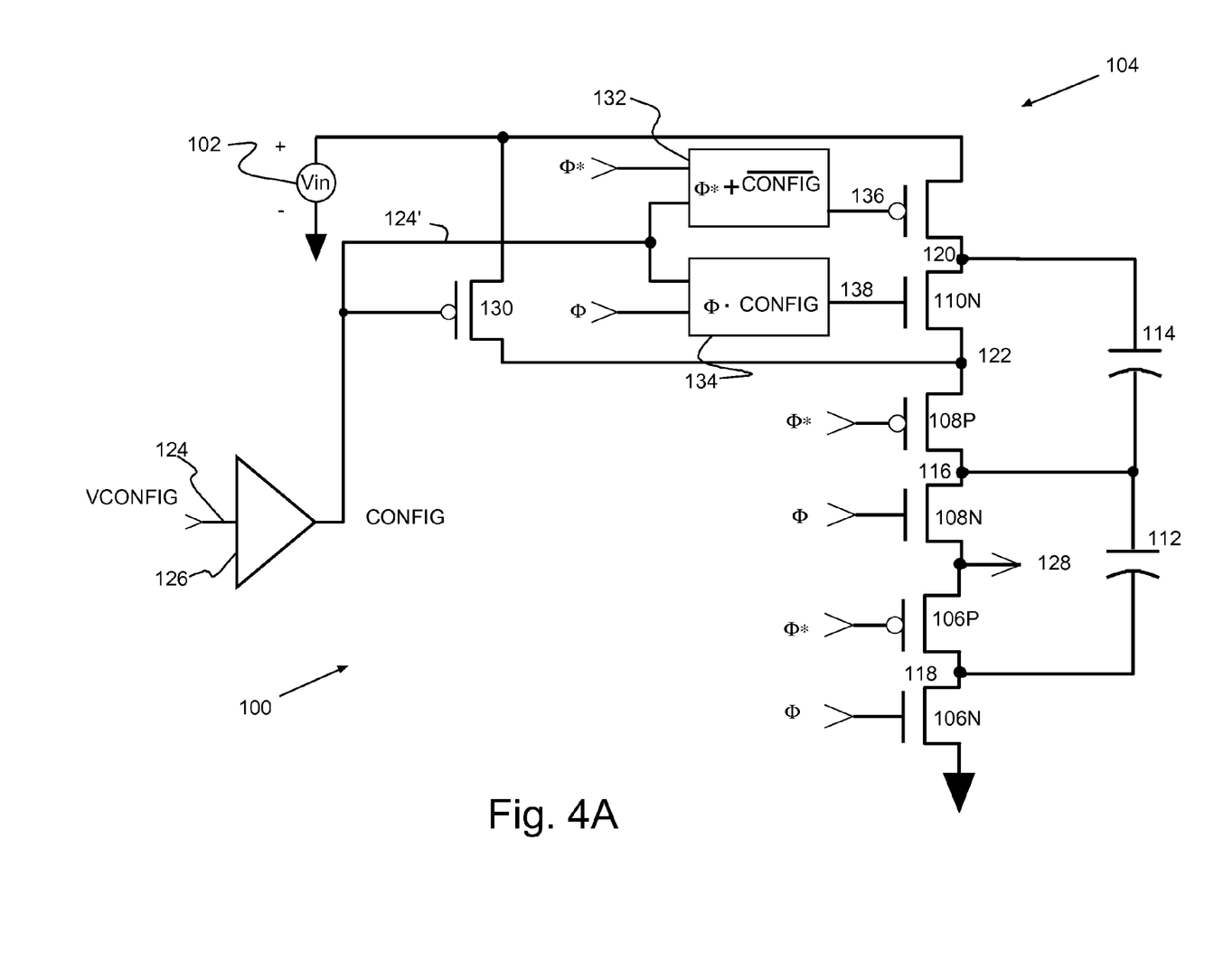
FIGS. 4A-B show an example of a preferred switched-capacitor, configurable-voltage converter circuit and timing, according to a preferred embodiment of the present invention.
Figure 4B:
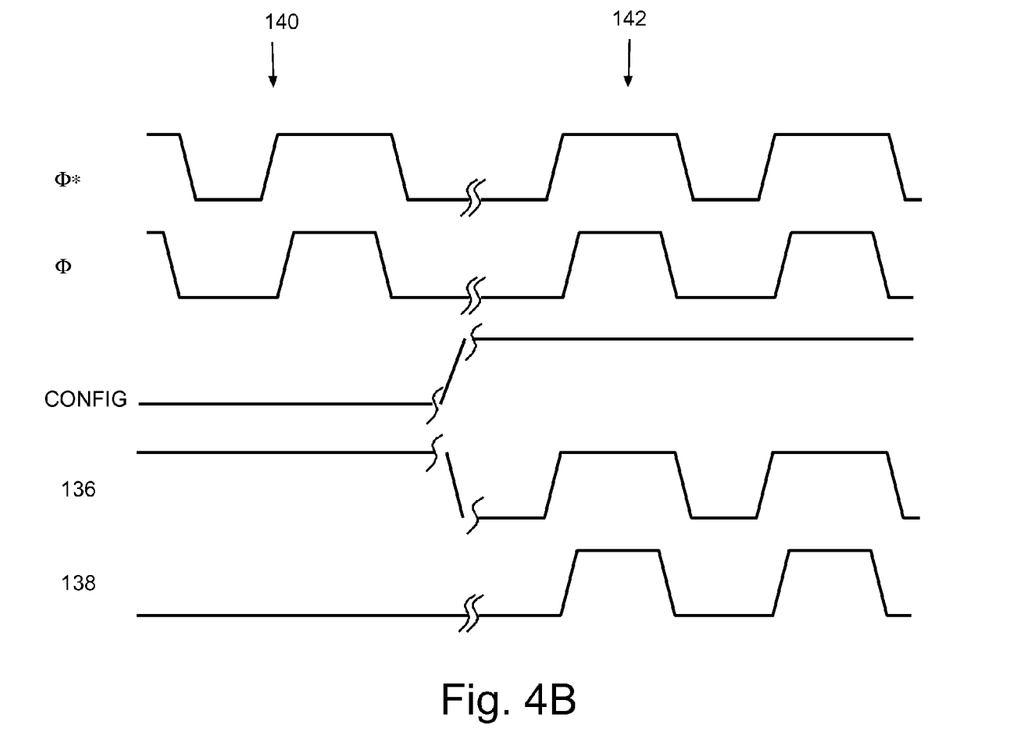

FIGS. 4A-B show an example of a preferred switched-capacitor, configurable-voltage converter circuit 100 and timing, according to a preferred embodiment of the present invention. In this example, the preferred configurable-voltage converter circuit 100 includes configurable totem arrangement between a first voltage ($V_1$) and a second voltage ($V_2$), a supply voltage ($V_{in}$) 102 and supply return (ground (GND)) in this example, and a configuration control 104. The configurable totem arrangement includes six FETs, three NFETs 106N, 108N, 110N and three PFETs 106P, 108P, 110P and two switched capacitors 112, 114, e.g., 2 nanoFarads (2 nF). The switched capacitors 112, 114 are connected to each other 116 between PN FET pair 108N, 108P and at opposite ends 118, 120 between PN FET pairs 106N, 106P and 110N, 110P. The bottom NFETs 106N, 108N and PFETs 106P, 108P are driven directly by in-phase non-overlapping phases ($\phi$, $\phi^*$), e.g., with a switching frequency f=200 MegaHertz (200 MHz).

In this example, the configuration control 104 is connected between the supply 102 and an intermediate node 122 at the top PN pair of FETs, 110N, 110P. The configuration control 104, selectively blocks or passes the in-phase non-overlapping phases ($\Phi$, $\Phi^*$) to the top PN pair FET, NFET 110N and PFET 110P, depending on whether the configurable-voltage converter circuit 100 is configured 2:1 or 3:1 mode, respectively. A mode select signal (VCONFIG) 124 passes through a level shifter 126 to provide a configuration selection signal (CONFIG) 124'. The preferred configurable-voltage converter circuit 100 provides a single selected output voltage ($V_{out}$) at the intermediate node 122 between the bottom two PN FET pairs 106N, 106P and 108N, 108P.

In this example, CONFIG 124, 124' low selects 2:1 mode ($V_{in}$ 102 to $V_{out}$ 128) or, high selects 3:1 mode. A PFET 130 connected between the supply 102 and the intermediate node 122 is gated by CONFIG 124'. The level shifter 126 passes CONFIG 124' to a pair of clock select circuits 132, 134. The clock phases (Φ, Φ*) are in phase, but non-overlapping to prevent orthogonalities, where both PFETs 106P, 108P, 110P and NFETs 106N, 108N, 110N are on simultaneously. The NFET phase Φ is asserted high; and the PFET phase Φ* is asserted low. The clock select circuits 132, 134, responsive to CONFIG 124', pass the respective clock phases (Φ, Φ*) to the gates 136, 138 of the top PN pair of FETs, 110N, 110P.

As can be seen from FIG. 4B, at steady state in 2:1 mode 140 CONFIG 124, 124' is low, PFET 130 is on, shunting or shorting the intermediate node 122 to the supply 102. Also in 2:1 mode, the outputs 136, 138 of clock select circuits 132, 134 are high and low, respectively, which turns off both FETs, 110P, 110N. With both FETs, 110P, 110N off, one end 120 of capacitor 114 is floating, i.e., open circuited. Thus, with the end of capacitor 114 open circuited and the source of PFET 108P shorted to the supply through PFET 130, the circuit 100 operates, substantially identically to the 2:1 circuit 50 of FIG. 1. At steady state in 3:1 mode 142 when CONFIG 124' is high, PFET 130 is off, clock select circuits 132, 134 pass the respective in-phase non-overlapping clock phases (ϕ, ϕ*) to PFET gates 136, 138, and the circuit 100 operates, substantially identically to the 3:1 circuit 70 of FIG. 3.

Figure 5:
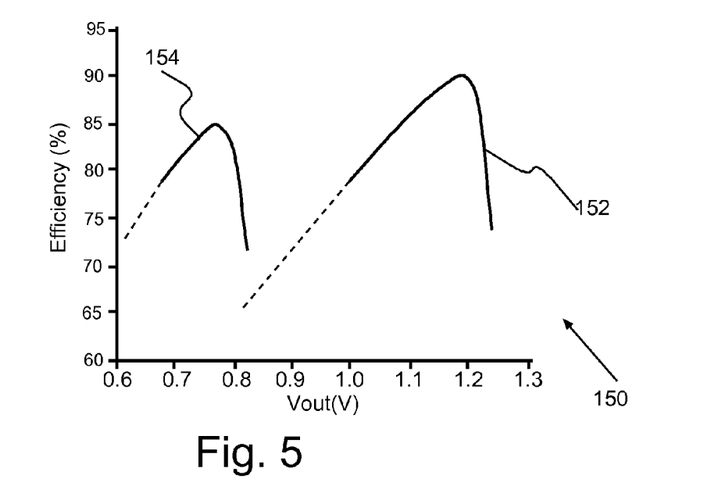
FIG. 5 shows a graphic example of efficiency of the preferred switched-capacitor, configurable-voltage converter circuit for $V_{out}$ in both 3:1 mode and 2:1 mode.

FIG. 5 shows a example 150 graphing efficiency of the preferred switched-capacitor, configurable-voltage converter circuit 100 for $V_{out}$ in both 3:1 mode 152 and 2:1 mode 154. For this example $V_{in}$ is 2.6V. It should be noted that although the example shown herein, is configurable for switching voltages between 2:1 and 3:1, it may be adapted to switching additional ratios or different ratios, e.g., by adding PN FET pairs to the totem with one or more appropriately connected capacitors and control logic.

Figure 6A:
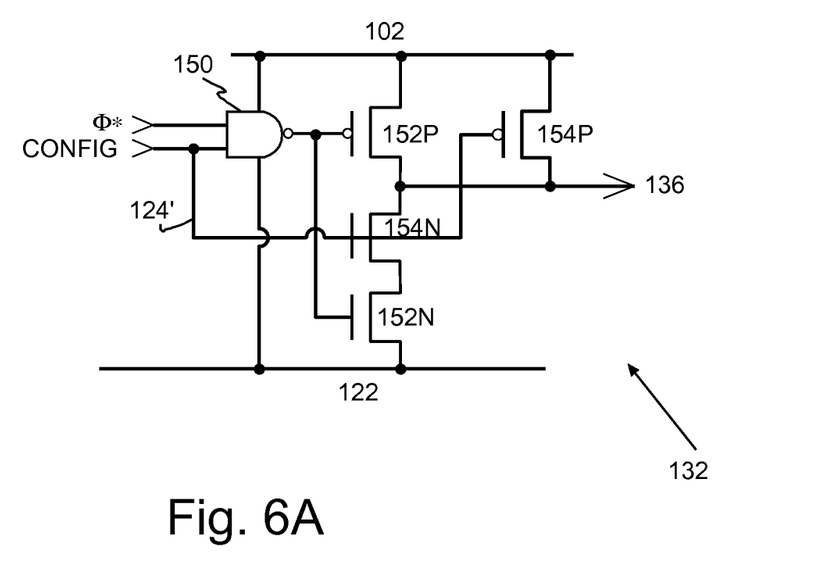
FIGS. 6A-B show an example of the clock select circuits.
Figure 6B:
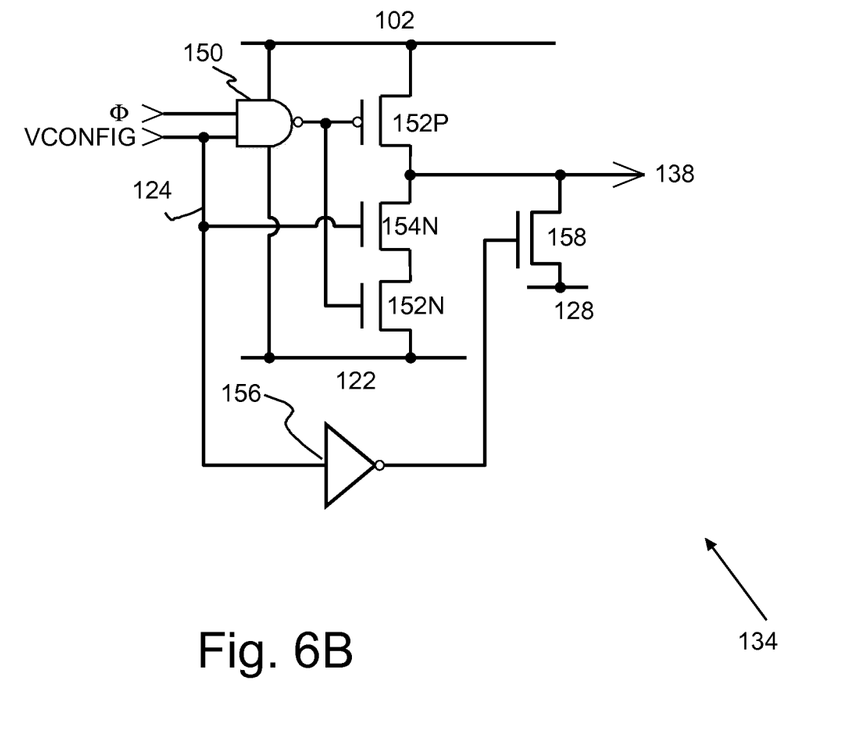

FIGS. 6A-B show an example of the clock select circuits 132, 134 with like elements labeled identically. In this example, the clock select circuits 132, 134 operate primarily between the supply 102 and the voltage at intermediate node 122. The level shifter (126 in FIG. 4A) shifts the mode select signal 124 to have a high signal level at the supply voltage 102 and a low signal level at the intermediate voltage 122. The PFET 110P clock gate 132 is essentially a pair of NAND gates 150 and 152N, 154N, 152P and 154P, with the first 150 substantially similar or identical to the second. Both the PFET clock phase (Φ*) and CONFIG 124' are inputs to NAND gate 150. The output of NAND gate 150, (Φ*+CONFIG)¬, is the input to the second NAND gate, i.e., FETs 152N and 154P, and CONFIG 124' is the other input. Thus, the clock gate 132 output 136 is Φ*+CONFIG¬ with a high signal level at the supply voltage 102 and a low signal level at the intermediate voltage 122 (3:2 $V_{in}$ in this example).

The NFET 110N clock gate 134 is substantially similar to the PFET 110P clock gate 132, except that the second NAND gate does not include gate PFET 154P. Thus, when CONFIG 124' is low, the clock gate 134 output 138 is not pulled high and floats. An inverter 156 (also between the supply 102 and the voltage at intermediate node 122) inverts CONFIG 124', to drive NFET 158. NFET 158, which is connected between the clock gate 134 output 138 and $V_{out}$ 128, NORs the second NAND result with CONFIG¬, and the result is Φ·CONFIG, with a high signal level at the supply voltage 102 and a low signal level at intermediate voltage 122, when 3:1 mode is selected, and at $V_{out}$ 128, when 2:1 mode is selected, which pulls the NFET gate below its source to assure that the NFET remains off.

Figure 7:
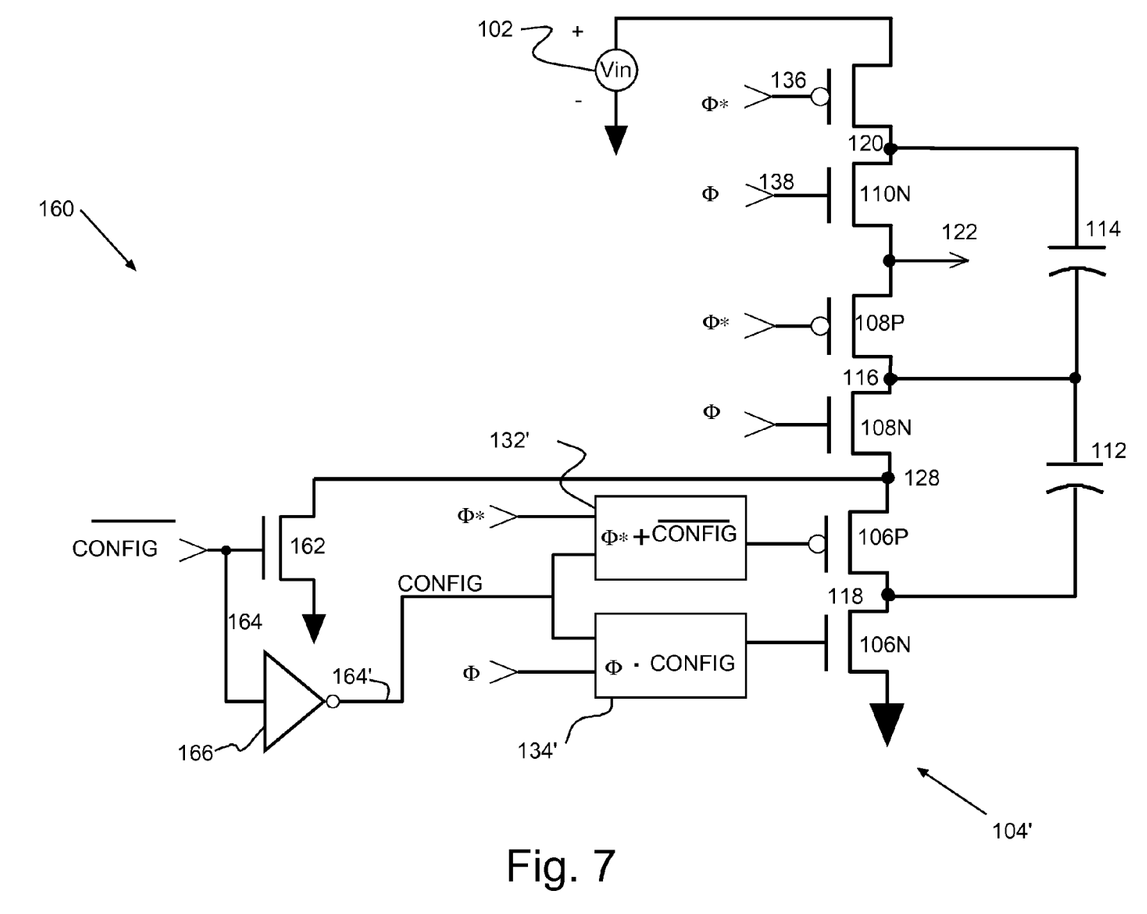
FIG. 7 shows another example of a preferred switched-capacitor, configurable-voltage converter circuit.

FIG. 7 shows another example of a preferred switched-capacitor, configurable-voltage converter circuit 160, substantially similar to the example of FIG. 4A with identical elements labeled identically. In this example, node 122 is the configured voltage output $V_{out}$, selectable as 3:2 or 2:1. An NFET 162 (instead of PFET 130) is gated by the configuration selection signal 164 CONFIG¬, inverted in this example, to selectively short intermediate (configured voltage output in the example of FIG. 4A) node 128 to ground. Also in this example, the configuration control 104' is connected between intermediate node 128 and ground, and across the bottom PN FET pair 106N, 106P. The level shifter 166, which is an inverter in this example, provides control signal CONFIG 164' to PFET 106P clock gate 132' and NFET 106N clock gate 134', which provide substantially identical logic to gates 132, 134 in FIG. 4A, except at voltage switching levels are referenced to ground.

Figure 8:
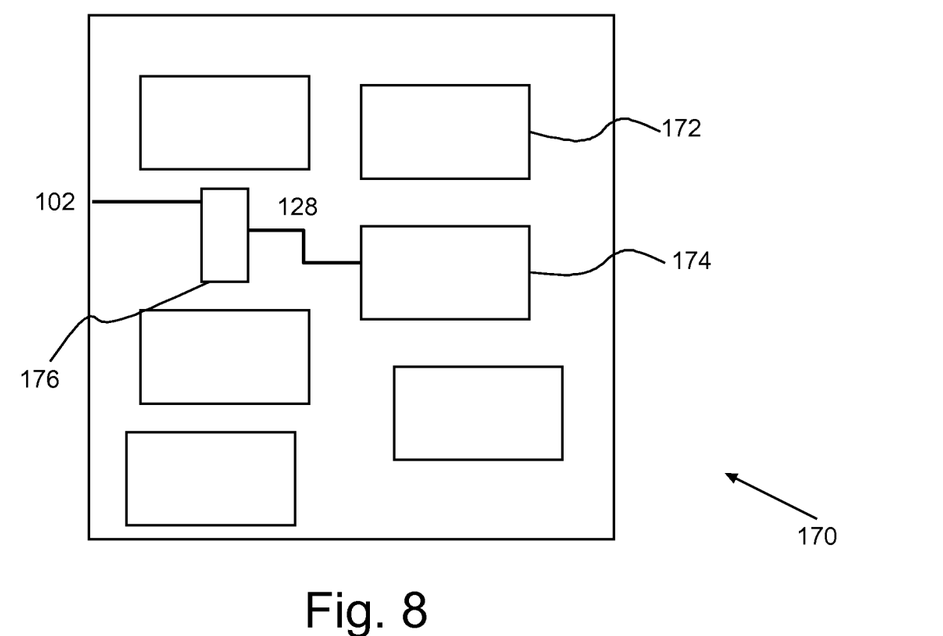
FIG. 8 shows an example of a of an Integrated Circuit (IC) chip with one or more circuits powered by a preferred switched-capacitor, configurable-voltage converter circuit.

FIG. 8 shows an example of a of an Integrated Circuit (IC) chip 170 with circuits 172, one 174 or more of which are powered by a preferred switched-capacitor, configurable-voltage converter circuit 176, e.g., 100 or 160. In this example 1 $V_{in}$ is a chip supply 102, and $V_{out}$ 128 is routed to the respective circuit(s) 174.

Advantageously, a preferred switched-capacitor, configurable-voltage converter circuit provides a low-cost, on-chip, multiple, selectable voltage supply. In particular a preferred converter circuit provides multiple selectable supply voltages from a single, relatively higher voltage for supplying on-chip power to lower voltage circuits. Further, because the lower voltages are capacitively switched from the higher voltage, chip supply switching currents are similarly reduced (3:1 or 2:1) from on-chip switching currents. Thus, the preferred converter circuit provides an efficient low voltage source with dramatically reduced chip level switching currents and associated switching noise.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A method of configuring on-chip supply voltage being supplied to one or more chip circuits, said method comprising:
   selecting a first voltage supply mode;
   floating one side of a first capacitor in a pair of series connected capacitors, the other side of said first capacitor being connected to a first side of a second capacitor of the series connected pair;
   alternately switching opposite sides of said second capacitor to a voltage supply output ($V_{out}$), one side of said second capacitor being alternately switched between a first supply voltage and said voltage supply output, the other side of said second capacitor being alternately switched between a second supply voltage and said voltage supply output, said voltage supply output supplying a first output voltage, wherein alternately switching said opposite sides in said first voltage supply mode comprises:
      floating one side of a first capacitor in a pair of series connected capacitors, the other side of said first capacitor being connected to a first side of a second capacitor of the series connected pair, asserting a first clock, coupling said first side of said second capacitor to said first supply voltage responsive to said first clock, coupling the other side of said second capacitor to said supply voltage output responsive to said first clock, asserting a second clock, said first clock and said second clock not overlapping, coupling said first side of said second capacitor to said supply voltage output responsive to said second clock, coupling the other side of said second capacitor to said second supply voltage responsive to said second clock, and returning to asserting said first clock;

selecting a second voltage supply mode;

alternately floating and coupling said one side of said first capacitor to said first supply voltage and simultaneously switching the other side of said second capacitor to said voltage supply output when said one side is floating, said first side of said second capacitor being alternately switched in and out to said voltage supply output, the other side of said second capacitor being alternately switched between said second supply voltage and said voltage supply output, said voltage supply output supplying a second output voltage; and waiting to reselect said first voltage supply mode.

2. A method of configuring on-chip supply voltage as in claim 1, wherein in said second voltage supply mode alternately floating and coupling said one side and alternately switching said opposite sides comprises:

asserting said first clock;

coupling said one side of said first capacitor to said first supply voltage responsive to said first clock;

coupling said other side of said second capacitor to said voltage supply output responsive to said first clock;

asserting a second clock, said one side of said second capacitor being floated;

coupling said other side of a said first capacitor to said voltage supply output responsive to said second clock;

coupling said other side of said second capacitor to said second supply voltage responsive to said second clock; and returning to asserting said first clock.

3. A method of configuring on-chip supply voltage as in claim 2, wherein said first capacitor is connected between a pair of FETs and floating said one side of said first capacitor comprises gating both FETs off.

4. A method of configuring on-chip supply voltage as in claim 3, wherein floating said one side of said first capacitor further comprises gating on an FET shorting the opposite ends of both off FETs.

5. A method of configuring on-chip supply voltage as in claim 4, wherein said chip is a CMOS chip, said pair of FETs is a PFET and an NFET in a FET totem including alternate PFETs and NFETs;

said other side of said first capacitor and said first side of a second capacitor of the series connected capacitor pair being connected between a second PN FET pair; and said other side of said second capacitor being connected between a second PN FET pair.

6. A method of configuring on-chip supply voltage as in claim 5, wherein asserting said first clock turns on totem PFETs and asserting said second clock turns on totem NFETs, the first PN FET pair being gated by said first clock and said second clock when said second mode is selected.

7. A method of configuring on-chip supply voltage as in claim 6, wherein said second supply voltage is a supply return for said first supply voltage ($V_{in}$).

8. A method of configuring on-chip supply voltage being supplied to one or more chip circuits, said method comprising:

selecting a first voltage supply mode;

floating one side of a first capacitor in a pair of series connected capacitors, the other side of said first capacitor being connected to a first side of a second capacitor of the series connected pair, and while said first voltage supply mode is selected, asserting a first clock, coupling said first side of said second capacitor to a first voltage supply line responsive to said first clock, coupling the other side of said second capacitor to an on-chip supply voltage output ($V_{out}$) responsive to said first clock, asserting a second clock, said first clock and said second clock not overlapping, coupling said first side of said second capacitor to said on-chip supply voltage output responsive to said second clock, coupling the other side of said second capacitor to a second voltage supply line responsive to said second clock, and returning to assert said first clock; and selecting a second voltage supply mode, and while said second voltage supply mode is selected, asserting said first clock, coupling said one side of said first capacitor to said first voltage supply line responsive to said first clock, coupling said other side of said second capacitor to said on-chip supply voltage output responsive to said first clock, asserting a second clock, coupling said one side of a said first capacitor to said on-chip supply voltage output responsive to said second clock, coupling said other side of said second capacitor to said second voltage supply line responsive to said second clock, and returning to assert said first clock.

9. A method of configuring on-chip supply voltage as in claim 8, wherein said first voltage supply mode is a 2:1 configuration mode, said second voltage supply mode is a 3:1 configuration mode and upon a next selection of said 2:1 mode, said method further comprising returning to float said one side of said first capacitor.

10. A method of configuring on-chip supply voltage as in claim 9, wherein said first capacitor is connected between a pair of FETs and floating said one side of said first capacitor comprises gating both FETs off.

11. A method of configuring on-chip supply voltage as in claim 10, wherein one of said first voltage supply line and said second voltage supply line is a supply return line and the other is a chip supply ($V_{in}$), floating said one side of said first capacitor further comprises gating on an FET shorting the opposite ends of both off FETs, and $V_{in}:V_{out}$ is selectable as 2:1 or 3:1.

12. A method of configuring on-chip supply voltage as in claim 11, wherein said chip is a CMOS chip, said pair of FETs is a PFET and an NFET in a FET totem including alternate PFETs and NFETs;

said other side of said first capacitor and said first side of a second capacitor of the series connected capacitor pair being connected between a second PN FET pair; and said other side of said second capacitor being connected between a second PN FET pair.

13. A method of configuring on-chip supply voltage as in claim 12, wherein asserting said first clock turns on totem PFETs and asserting said second clock turns on totem NFETs, the first PN FET pair being gated by said first clock and said second clock when said second mode is selected.

14. A method of configuring on-chip supply voltage as in claim 13, wherein said second supply voltage line is said supply return for said first supply voltage line ($V_{in}$).

15. A method of configuring on-chip supply voltage being supplied to one or more CMOS chip circuits, said method comprising:
selecting a first voltage supply mode;
floating one side of a first capacitor in a pair of series connected capacitors connected to a field effect transistor (FET) totem connected between a first supply ($V_1$) and a second supply ($V_2$), the other side of said first capacitor being connected to a first side of a second capacitor of the series connected pair, said one side being connected between a first PFET and NFET (PN FET) totem pair, said other side and said first side being connected between a second PN FET totem pair and the opposite side of said second capacitor being connected between a third PN FET totem pair;
alternately turning PFETs off and on and NFETs on and off in the second and third PN FET totem pair, said second and third PN FET totem pairs alternately switching opposite sides of said second capacitor to a voltage supply output ($V_{out}$), wherein alternately switching said opposite sides in said first voltage supply mode comprises:
in a first half cycle PFETs in both said the second and third PN FET totem pair being switched on, said PFET in said second PN FET totem pair switching said first side of said second capacitor to $V_1$, and said PFET in said third PN FET totem pair switching said opposite side of said second capacitor to $V_{out}$, the corresponding NFETs in both pair being off, and
in a second half cycle by switching PFETs off and NFETs on, on NFETs switching said first side of said second capacitor to $V_{out}$ and said other side of said second capacitor to $V_2$;
selecting a second voltage supply mode;
alternately turning PFETs off and on and NFETs on and off in the first, second and third PN FET totem pairs, said first PN FET totem pair alternately floating and coupling said one side of said first capacitor to $V_1$, and said second and third PN FET totem pairs simultaneously alternately switching said other side of said second capacitor to $V_{out}$ when said one side is floating, said second and third PN FET totem pairs alternately switching opposite sides of said second capacitor to $V_{out}$; and
waiting to reselect said first voltage supply mode.

16. A method of configuring on-chip supply voltage as in claim 15, wherein floating one side in said first voltage supply mode comprises:
shorting said first PN FET pair; and
holding off both the PFET and NFET in said first PN FET pair, said first side being connected between said PFET and NFET.

17. A method of configuring on-chip supply voltage as in claim 16, wherein $V_1$ is $V_{in}$, $V_2$ is ground and shorting said first PN FET pair comprises turning on a shunting PFET in parallel with said first PN FET pair.

18. A method of configuring on-chip supply voltage as in claim 17, wherein alternately switching said opposite sides in said first voltage supply mode comprises:
asserting a PFET clock low, an NFET clock being low while said PFET clock is asserted, said PFET in said second PN FET pair coupling said first side of said second capacitor to one side of said shunt PFET, said PFET in said third PN FET pair coupling said other side of said second capacitor to said $V_{out}$;
driving said PFET clock high;
asserting said NFET clock high, said NFET in said second PN FET pair coupling said first side of said second capacitor to $V_{out}$, said NFET in said third PN FET pair coupling the other side of said second capacitor to said supply return;
driving said NFET clock low; and
returning to asserting said PFET clock low.

19. A method of configuring on-chip supply voltage as in claim 18, wherein alternately floating and coupling said one side of said first capacitor in said second voltage supply mode comprises:
turning said shunting PFET off; and
passing said PFET clock through a PFET clock gate to the gate of said PFET in said first PN FET pair and said NFET through an NFET clock gate to the gate of said NFET in said first PN FET pair.

20. A method of configuring on-chip supply voltage as in claim 16, wherein $V_1$ is ground, $V_2$ is $V_{in}$, shorting said first PN FET pair comprises turning on a shunting NPFET in parallel with said first PN FET pair, and $V_{in}:V_{out}$ is selectable as 2:1 in said first voltage supply mode or 3:1 in said second voltage supply mode.

21. A method of configuring on-chip supply voltage being supplied to one or more CMOS chip circuits, said method comprising:
asserting a configuration select in a first state, said first state selecting a first voltage supply mode;
turning a shunting field effect transistor (FET) on, said shunting FET shorting a first PFET and NFET pair (PN FET pair) in a FET totem connected between a first supply voltage ($V_1$) and a second supply voltage ($V_2$), one side of a first capacitor in a pair of series connected capacitors connected between the PFET and NFET in said first PN FET pair;
blocking a PFET clock and an NFET clock to said first PN FET pair, both the PFET and NFET in said first PN FET pair being held off, said one side of said first capacitor floating;
switching on PFETs in said the second and third PN FET totem pair in a first half cycle, said PFET in said second PN FET totem pair switching said first side of said second capacitor to $V_1$, and said PFET in said third PN FET totem pair switching the opposite side of said second capacitor to $V_{out}$, the corresponding NFETs in both pair being off;
switching said PFETs off in a second half cycle and NFETs on, on NFETs switching said first side of said second capacitor to $V_{out}$ and said other side of said second capacitor to $V_2$;
returning to switching on PFETs until said configuration select is asserted in a second state, and when asserted in said second state a second voltage supply mode has been selected; and then
turning off said shunting FET;
passing said PFET clock and said NFET clock to said first PN FET pair, both the PFET and NFET in said first PN FET pair being gated on by a respective clock;

switching on PFETs in the first, second and third PN FET totem pairs in a first half cycle, said PFET in said first PN FET totem pair switching said one side of said first capacitor to $V_1$, and said PFET in said third PN FET totem pair switching the opposite side of said second capacitor to $V_{out}$, the corresponding NFETs in said first, second and third PN FET totem pairs being off;

switching said PFETs off in a second half cycle and NFETs on, on NFETs switching said first side of said second capacitor to $V_{out}$ and said other side of said second capacitor to $V_1$; and returning to switching on PFETs in all three PN FET totem pairs until said first voltage supply mode is reselected.

22. A method of configuring on-chip supply voltage as in claim 21, wherein $V_1$ is $V_{in}$, $V_1$ is ground, and $V_{in}$:$V_{out}$ is selectable as 2:1 in said first voltage supply mode or 3:1 in said second voltage supply mode.

* * * * *